(12) United States Patent
Cho

(10) Patent No.: US 9,425,787 B2
(45) Date of Patent: Aug. 23, 2016

(54) GATE DRIVING DEVICE AND INVERTER HAVING THE SAME

(71) Applicant: SAMSUNG ELECTRO-MECHANICS CO., LTD., Suwon-Si (KR)

(72) Inventor: Won Jin Cho, Suwon-Si (KR)

(73) Assignee: SAMSUNG ELECTRO-MECHANICS CO., LTD., Suwon-Si, Gyeonggi-Do (KR)

(*) Notice: Subject to any disclaimer, the term of this patent is extended or adjusted under 35 U.S.C. 154(b) by 144 days.

(21) Appl. No.: 14/265,023

(22) Filed: Apr. 29, 2014

(65) Prior Publication Data

US 2015/0146468 A1 May 28, 2015

(30) Foreign Application Priority Data

Nov. 26, 2013 (KR) ........................ 10-2013-0144468

(51) Int. Cl.
*H02M 7/537* (2006.01)
*H03K 17/68* (2006.01)
*H02M 7/5387* (2007.01)

(52) U.S. Cl.
CPC ............. *H03K 17/68* (2013.01); *H02M 7/5387* (2013.01)

(58) Field of Classification Search
CPC ...... H03K 17/68; H02M 7/537; H02M 7/5387
USPC .................................. 363/131, 132; 307/109
See application file for complete search history.

(56) References Cited

U.S. PATENT DOCUMENTS 8,030,908 B2 * 10/2011 Huang ................ H02M 3/1584
323/237
2005/0116744 A1 6/2005 Iwagami et al.

FOREIGN PATENT DOCUMENTS

| KR | 2005-0052339 A | 6/2005 |
| KR | 2007-0088869 A | 8/2007 |

* cited by examiner

*Primary Examiner* — Yemane Mehari
(74) *Attorney, Agent, or Firm* — McDermott Will & Emery LLP

(57) ABSTRACT

A gate driving device may include a plurality of inverter arms, respective inverter arms including a high-side switch and a low-side switch, a gate driving unit including a multi-channel gate driver that outputs control signals to control switching of the plurality of inverter arms, and a plurality of gate drivers, respective gate drivers receiving one of the control signals to output it to a corresponding high-side switch, and a balancing unit maintaining balance of voltage between the multi-channel gate driver and the plurality of gate drivers.

13 Claims, 5 Drawing Sheets

GATE DRIVING DEVICE AND INVERTER HAVING THE SAME

CROSS-REFERENCE TO RELATED APPLICATION

This application claims the benefit of Korean Patent Application No. 10-2013-0144468 filed on Nov. 26, 2013, with the Korean Intellectual Property Office, the disclosure of which is incorporated herein by reference.

BACKGROUND

The present disclosure relates to a gate driving device driven at high voltage and an inverter having the same.

Generally, an inverter is a circuit element that receives direct current power to output alternating current power and is capable of controlling the amplitude of a voltage, a frequency and the like of output alternating current power, thereby outputting alternating current power for driving a motor or the like.

Such an inverter may be widely used in domestic, commercial and industrial applications.

A driving device may be employed to drive such an inverter, which drives the inverter byway of turning switches of inverter arms on and off to supply alternating current power.

For industrial applications of the inverter, high voltage alternating current power may be required depending on industrial requirements.

A typical inverter may employ gate driving integrated circuits, each of which turns a high-side switch and a low-side switch of an inverter arm on and off, respectively. With this configuration, since high voltage is applied to the high-side switch, the gate driving integrated circuit turning the high-side switch on and off should have withstanding voltage characteristics against high voltage level applied to the high-side switch.

In an inverter for industrial use, a voltage of approximately 1200V may be applied to the high-side switch, and thus the gate driving integrated circuit controlling the high-side switch needs to have withstand voltage characteristics of 1200V or higher. However, such a gate driving integrated circuit having high withstand voltage characteristics is relatively expensive to manufacture.

SUMMARY

An embodiment in the present disclosure may provide a gate driving device stably operable at high voltage, and an inverter having the same.

An embodiment in the present disclosure may also provide a gate driving device capable of preventing voltages above a withstand voltage level from being applied in a transient state, and an inverter having the same.

According to an embodiment in the present disclosure, a gate driving device may include: a plurality of inverter arms, respective inverter arms including a high-side switch and a low-side switch; a gate driving unit including a multi-channel gate driver that receives an instruction signal to instruct switching of the plurality of inverter arms and outputs control signals to control switching of the plurality of inverter arms, and a plurality of gate drivers, respective gate drivers receiving one of the control signals to output it to a corresponding high-side switch; and a balancing unit maintaining balance of voltage between the multi-channel gate driver and the plurality of gate drivers.

The balancing unit may include a plurality of balancers, respective balancers among the plurality of balancers being connected to the multi-channel gate driver and to the respective gate drivers and equally dividing voltage applied to the multi-channel gate driver and respective gate drivers among the plurality of gate drivers.

Respective balancers may include a resistor connected to the multi-channel gate driver and the respective gate drivers in parallel.

Respective balancers may include a capacitor connected to the resistor in parallel.

The balancing unit may maintain a state of voltage divided among the plurality of gate drivers when a signal output from one of the plurality of gate drivers is changed from a high level to a low level.

The gate driving device may further include a single voltage source supplying the gate driving unit with supply voltage.

The gate driving device may further include a voltage supply unit transmitting the supply voltage to the gate drivers.

The voltage supply unit may include a plurality of diodes connected to one another in series.

The voltage supply unit may include a plurality of diodes connected to one another in parallel.

According to an embodiment in the present disclosure, an inverter may include: an inverter unit including a plurality of inverter arms, respective inverter arms including a high-side switch and a low-side switch connected in series between an input terminal at which an input voltage of a predetermined level is received and a ground, and switching the input voltage so as to output alternating current power; a gate driving unit including a multi-channel gate driver that receives instruction signals to instruct switching control of the plurality of inverter arms and outputting control signals to control the switching of the plurality of inverter arms, and a plurality of gate drivers receiving a switching control signal for the high-side switch of one of the plurality of inverter arms from the multi-channel gate driver and outputting a signal corresponding to the received control signal to the high-side switch; and a balancing unit dividing voltage applied to the plurality of gate drivers between the multi-channel gate driver and respective gate drivers among the plurality of gate drivers, according to the switching of the high-side switches, and maintaining the divided voltage between the multi-channel gate driver and respective gate drivers among the plurality of gate drivers.

The balancing unit may include a plurality of balancers, respective balancers among the plurality of balancers being connected to the multi-channel gate driver and to the respective gate drivers and equally dividing voltage applied to respective gate drivers among the plurality of gate drivers.

Respective balancers may include a resistor connected to the multi-channel gate driver and the respective gate drivers in parallel.

Respective balancers may include a capacitor connected to the resistor in parallel.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
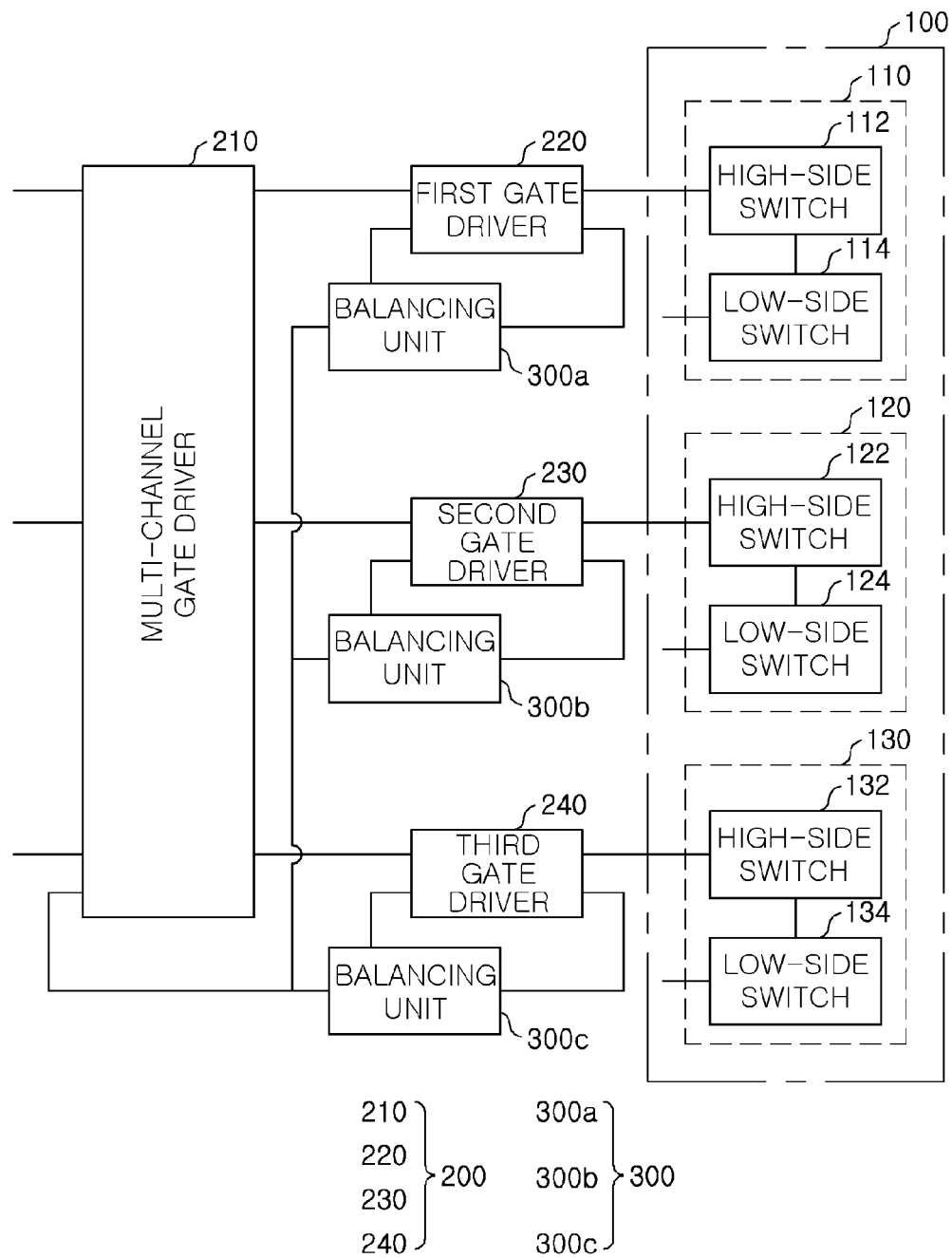
FIG. 1 is a block diagram of a gate driving device according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

Figure 2:
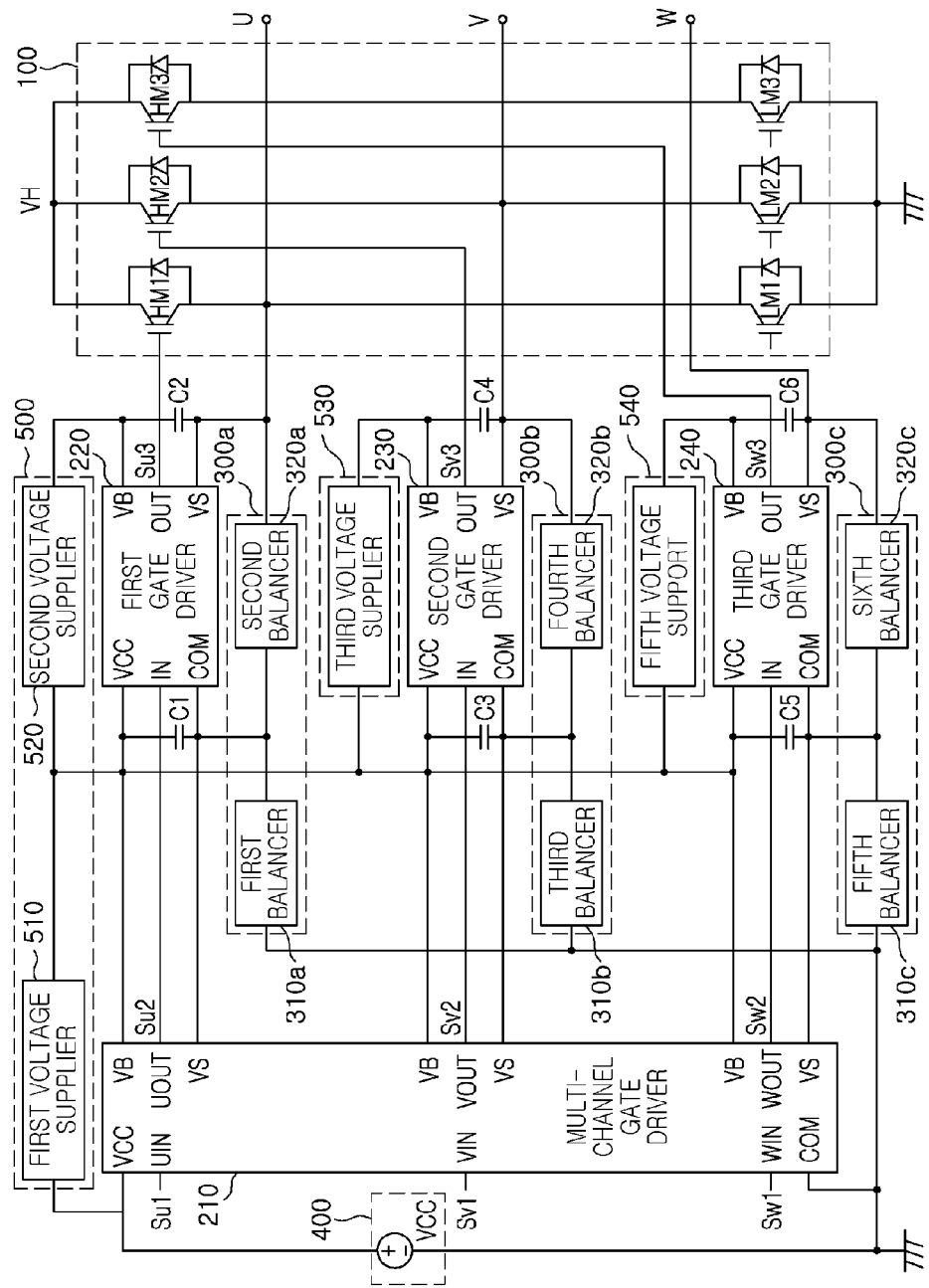
FIG. 2 is a diagram of a gate driving device according to another exemplary embodiment of the present disclosure.

FIG. 1 is a block diagram of a gate driving device according to an exemplary embodiment of the present disclosure, and FIG. 2 is a diagram of a gate driving device according to another exemplary embodiment of the present disclosure.

Referring to FIGS. 1 and 2, the gate driving device according to the exemplary embodiment of the present disclosure may include an inverter unit 100 including a plurality of inverter arms 110, 120 and 130, and a gate driving unit 200.

The inverter unit 100 may switch input voltage VH to output alternating current power. Further, the inverter unit 100 may include the plurality of inverter arms 110, 120 and 130, each of which has a high-side switch HM1, HM2 and HM3, and a low-side switch LM1, LM2 and LM3, respectively, that are connected in series between the input terminal at which the input voltage VH is received and a ground.

In case of a three-phase inverter that outputs three-phase alternating current power, the inverter unit 100 may include a first inverter arm 110 that outputs power having a first phase, a second inverter arm 120 that outputs power having a second phase, and a third inverter arm 130 that outputs power having a three phase.

The high-side switches may be switched on and off according to control signals from the gate driving unit 200. The high-side switches 112, 122 and 132 may be switched on and off according to the control signals Su3, Sv3 and Sw3 from the high-voltage gate driving unit 200, respectively. The low-side switches 114, 124 and 134 may be switched on and off according to control signals from low-voltage gate driving unit (not shown).

The gate driving unit 200 may control the switching of the inverter unit 100 and may be connected between an instruction signal input terminal to which instruction signals Su1, Sv1 and Sw1 to instruct the switching of the inverter arms 110, 120 and 130 of the inverter unit 100 are input, and a control signal output terminal from which the control signals Su3, Sv3 and Sw3 to control the switching of the inverter unit 100 are output.

The gate driving unit 200 may include a multi-channel gate driver 210, and a plurality of gate drivers 220, 230 and 240.

The multi-channel gate driver 210, upon receiving the instruction signals Su1, Sv1 and Sw1, may output signals Su2, Sv2 and Sw2 containing information relating to switching control included in the instruction signals Su1, Sv1 and Sw1 to corresponding gate drivers 220, 230 and 240.

Respective gate drivers among the plurality of gate drivers 220, 230 and 240 is a single-channel gate driver and may receive one of the signals Su2, Sv2 and Sw2 output from the multi-channel gate driver 210 to transmit the control signals Su3, Sv3 or Sw3 that is coincident with the intention of switching control of the one of the instruction signals Su1, Sv1 and Sw1 to the corresponding one of the inverter arms 110, 120 or 130, thereby controlling the switching of the corresponding high-side switch HM1, HM2 or HM3.

A balancing unit 300 may maintain balance of voltage between the multi-channel gate driver 210 and the plurality of gate drivers 220, 230 and 240. Specifically, as the high-side switches HM1, HM2 and HM3 are switched on and off, an input power having a voltage level corresponding to the input voltage VH may be applied to the high-voltage gate driving unit 200, and the balancing unit 300 may divide and apply the voltage so that the voltage level of the applied power is divided between the multi-channel gate driver 210 and respective gate drivers among the plurality of gate drivers 220, 230 and 240.

In an exemplary embodiment, the balancing unit 300 may include a plurality of balancers 310a, 310b, 310c, 320a, 320b and 320c. The plurality of balancers 310a, 310b, 310c, 320a, 320b and 320c may be connected to the multi-channel gate driver 210 and respective gate drivers among the plurality of gate drivers 220, 230 and 230 so as to equally divide the voltage applied to the multi-channel gate driver 210 and respective gate drivers among the plurality of gate drivers 220, 230 and 230 among them.

Referring to FIG. 2, the balancing unit 300 may include a first balancer 310a, a second balancer 320a, a third balancer 310b, a fourth balancer 320b, a fifth balancer 310c, and a sixth balancer 320c.

The first balancer 310a, the third balancer 310b and the fifth balancer 310c may be connected to the multi-channel gate driver 210 in parallel. The second balancer 320a may be connected to the first gate driver 220 in parallel. The fourth balancer 320b may be connected to the second gate driver 230 in parallel. The six balancer 320c may be connected to the third gate driver 240 in parallel.

Accordingly, the voltage level of the power applied to the multi-channel gate driver 210 and to the first gate driver 220 may be equally divided by the first balancer 310a and the second balancer 320a, the voltage level of the power applied to the multi-channel gate driver 210 and to the second gate driver 220 may be equally divided by the third balancer 310b and the fourth balancer 320b, and the voltage level of the power applied to the multi-channel gate driver 210 and to the third gate driver 220 may be equally divided by the fifth balancer 310c and the sixth balancer 320c.

Further, the gate driving device according to an exemplary embodiment of the present disclosure may include a single voltage source 400 supplying supply voltage to the gate driving unit 200.

Further, in order to apply the supply voltage Vcc to the multi-channel driver 210 and the plurality of gate drivers 220, 230 and 240, the gate driving device may further include a voltage supply unit 500.

The voltage supply unit 500 may include a plurality of voltage suppliers 510, 520, 530 and 540, which may supply the single supply voltage Vcc to terminals of the multi-channel gate driver 210 and the plurality of gate drivers 220, 230 and 240.

According to an exemplary embodiment of the present disclosure, when ON signals are applied to the low-side switches LM1, LM2 and LM3 while OFF signals are applied to the high-side switches HM1, HM2 and HM3, first to sixth capacitors C1 to C6 are charged with Vcc by the single voltage source 400 and the voltage supply unit 500. Then, when OFF signals are applied to the low-side switches LM1, LM2 and LM3 while ON signals are applied to the high side switches HM1, HM2 and HM3, input power having the voltage level corresponding to input voltage VH may be applied to the gate driving unit 200.

The applied voltage may be applied to VS terminals of the plurality of gate drivers 220, 230 and 240. In addition, the voltage applied to the VS terminal, and the voltage at VB terminals of the plurality of gate drivers 220, 230 and 240 may be determined by the second capacitor C2, the fourth capacitor C4 or the sixth capacitor C6.

For example, the voltage at the VB terminal of the first gate driver 220 may be the sum of the voltage applied to the VS terminal of the first gate driver 220 and the voltage charged in the second capacitor C2.

If the voltage applied to the multi-channel gate driver and to the plurality of gate drivers 220, 230 and 240 is equally divided by the first to sixth balancers 310a to 320c, the divided voltage may be applied to the VS terminal of each channel of the multi-channel gate drivers 210. Further, the voltage applied to the VB terminal of each channel of the multi-channel gate driver 210 may be determined by the voltage applied to the VS terminal of each channel of the multi-channel gate drivers 210 and the capacitor C1, C3 or C5 connected to the VS terminal of each channel may be determined.

For example, the voltage at the VB terminal of the U channel of the multi-channel gate driver 210 may be the sum of the voltage applied to the VS terminal of the U channel of the multi-channel gate driver 210 and the voltage charged in the first capacitor C1.

Accordingly, the range of the voltage of the control signals Su3, Sv3 and Sw3 for driving the high-side switches HM1, HM2 and HM3 at the output terminals OUT may be determined by the voltage applied to the VS terminals of the plurality of gate drivers 220, 230 and 240 and the voltage applied to the Vcc terminals of the plurality of gate drivers 220, 230 and 240.

Further, the range of the voltage at the output terminal OUT of each channel of the multi-channel driver 210 may be determined by the voltage applied to the VS terminal of each channel of the multi-channel gate driver 210 and the voltage applied to the Vcc terminal of the multi-channel gate driver 210.

That is, the range of voltage at the signal output terminals OUT of the plurality of gate drivers 220, 230 and 240 may be the voltage level applied to VB terminals of the plurality of gate drivers 220, 230 and 240 (VH+VCC, for example). Further, the range of the voltage at the output terminal OUT of each channel of the multi-channel driver 210 may be the voltage level applied to the VB terminal of each channel of the multi-channel gate driver 210 (0.5*VH+VCC, for example).

In addition, the range of the voltage applied to the input terminal UIN, VIN and WIN of each channel of the multi-channel gate driver 210 may be between the voltage level voltage level (e.g., 0 V) applied to the COM terminal of the multi-channel gate driver 210 and the voltage level (e.g., Vcc) applied to the Vcc terminal of the multi-channel gate driver 210.

On the other hand, the switching of the low-side switches LM1, LM2 and LM3 may be controlled by a low-voltage gate driving unit (not shown).

To summarize, the inverter according to the exemplary embodiment of the present disclosure may include: the inverter unit 100 that includes a plurality of inverter arms 110, 120 and 130 including high-side switches HM1, HM2 and HM3 and low-side switches LM1, LM2 and LM3 connected in series between the input terminal at which an input voltage VH of a predetermined level is received and a ground, and switches the input voltage VH so as to output alternating current power; the gate driving unit 200 that includes a multi-channel gate driver 210 receiving instruction signals Sv1, Su1 and Sw1 to instruct switching control of the plurality of inverter arms 110, 120 and 130 and outputting the control signals Sv2, Su1 and Sw3 to control the switching of the plurality of inverter arms 110, 120 and 130, and a plurality of gate drivers receiving the switching control signals for the high-side switches HM1, HM2 and HM3 of one of the plurality of inverter arms 110, 120 and 130 from the multi-channel gate driver 210 and outputting signals corresponding to the received control signals to the high-side switches; and the balancing unit 300 dividing voltage applied to the plurality of gate drivers 220, 230 and 240 according to the switching of the high-side switches HM1, HM2 and HM3 between the multi-channel gate driver 210 and respective gate drivers among the plurality of gate drivers 220, 230 and 240 and maintaining the divided voltage between the multi-channel gate driver 210 and the plurality of gate drivers 220, 230 and 240.

Figure 3:
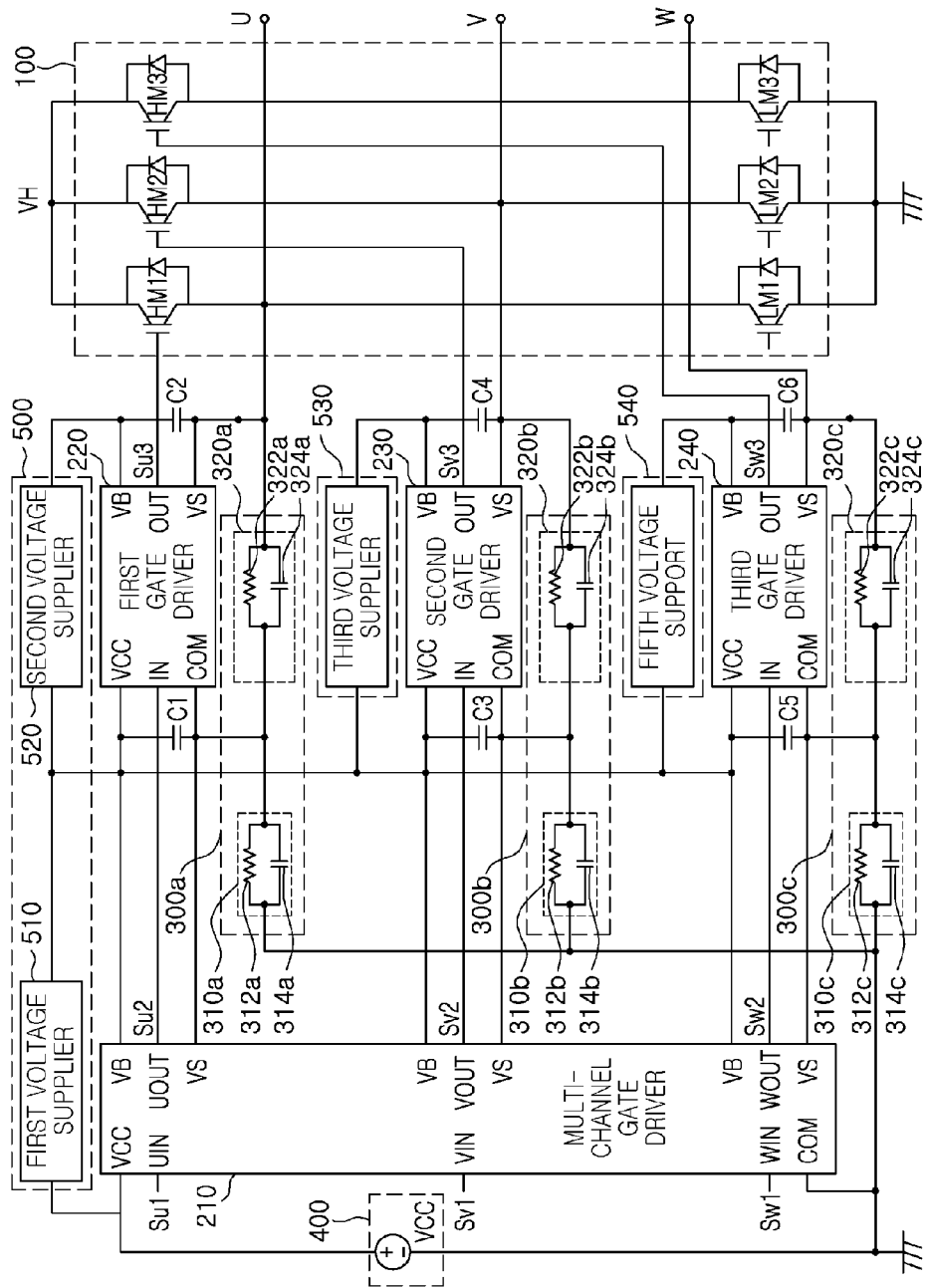
FIG. 3 is a diagram for illustrating an example of the balancing unit shown in FIG. 2.

FIG. 3 is a diagram for illustrating an example of the balancing unit shown in FIG. 2.

Referring to FIG. 3, the balancing unit 300 may include a first balancer 310a, a third balancer 310b and a fifth balancer 310c for a multi-channel gate driver 210, a second balancer 320a for a first gate driver 220, a fourth balancer 320b for a second gate driver 230, and a sixth balancer 320c for a third gate driver 240.

In the gate driver device shown in FIG. 3, other elements than the balancing unit 300 are identical to those described above and, therefore, detailed descriptions on the other elements will be omitted.

The first balancer 310a may include a first resistor 312a and a first capacitor 314a. The first resistor 312a may be connected to the multi-channel gate driver 210 in parallel. Further, the first capacitor 314a may be connected to the first resistor 312a in parallel.

The second balancer 310a may include a second resistor 322a and a second capacitor 324a. The second resistor 322a may be connected to the first gate driver 210 in parallel. Further, the second capacitor 324a may be connected to the second resistor 322a in parallel.

The third balancer 310b may include a third resistor 312b and a third capacitor 314b. The third resistor 312b may be connected to the multi-channel gate driver 210 in parallel. Further, the third capacitor 314b may be connected to the third resistor 312b in parallel.

The fourth balancer 320b may include a fourth resistor 322b and a fourth capacitor 324b. The fourth resistor 322b may be connected to the second gate driver 220 in parallel. Further, the fourth capacitor 324b may be connected to the fourth resistor 322b in parallel.

The fifth balancer 310a may include a fifth resistor 312c and a fifth capacitor 314c. The fifth resistor 312c may be connected to the multi-channel gate driver 210 in parallel. Further, the fifth capacitor 314c may be connected to the fifth resistor 312c in parallel.

The sixth balancer 310a may include a sixth resistor 322c and a sixth capacitor 324c. The sixth resistor 322c may be connected to the third gate driver 240 in parallel. Further, the sixth capacitor 324c may be connected to the sixth resistor 322c in parallel.

Referring to FIG. 3, if the resistance of the first resistor 312a and the resistance of the second resistor 322a are of the same value, the voltage may be equally divided into the multi-channel gate driver 210 and the first gate driver 220. Likewise, if the resistance of the third resistor 312b and the resistance of the fourth resistor 322b are of the same value, the voltage may be equally divided into the multi-channel gate driver 210 and the second gate driver 230. Further, if the resistance of the fifth resistor 312c and the resistance of the sixth resistor 322c are of the same value, the voltage may be equally divided into the multi-channel gate driver 210 and the third gate driver 240.

The first to sixth capacitors 314a to 324c may prevent unbalancing in voltage dividing which may occur in a transient state between the multi-channel gate driver 210 and the first gate driver 220, between the multi-channel gate driver 210 and the second gate driver 230, and between the multi-channel gate driver 210 and the third gate driver 240.

Here, the transient state may refer to a period of time in which output signals Su1, Sv2, Sw2, Su3, Sv3 and Sw3 from the multi-channel gate driver 210 or the plurality of gate driver 220, 230 and 240 are changed from a high level to a low level.

That is, if a signal output from at least one of the multi-channel gate driver 210 and the plurality of gate drivers 220, 230 and 240 is changed from a high level to a low level, the balancing unit 300 may maintain the state of the voltage divided into the multi-channel gate driver 210 and the plurality of gate drivers.

The first to sixth capacitors 314a to 316c may maintain the balance of the voltage between the multi-channel gate driver 210 and the plurality of gate drivers 220, 230 and 240 even if a transient state occurs.

According to the exemplary embodiments of the present disclosure, in switching an input voltage of approximately 1200 V, by virtue of the multi-channel gate driver 210 and the plurality of gate drivers 220, 230 and 240, a gate driving circuit having withstand voltage characteristics lower than 1200 V may be employed.

For example, instead of employing an expensive gate driving circuit having withstanding voltage of 1200V, by dividing voltage applied to the high-voltage gate driving unit at the time of switching among the plurality of gate drivers, the driving circuit is stably operated and accordingly the manufacturing cost can be reduced.

Further, according to exemplary embodiments of the present disclosure, the first to sixth capacitors 314a to 316c may prevent voltage above the withstand voltage from being applied to the multi-channel gate driver 210 and the plurality of gate drivers 220, 230 and 240 in a transient state.

Figure 4:
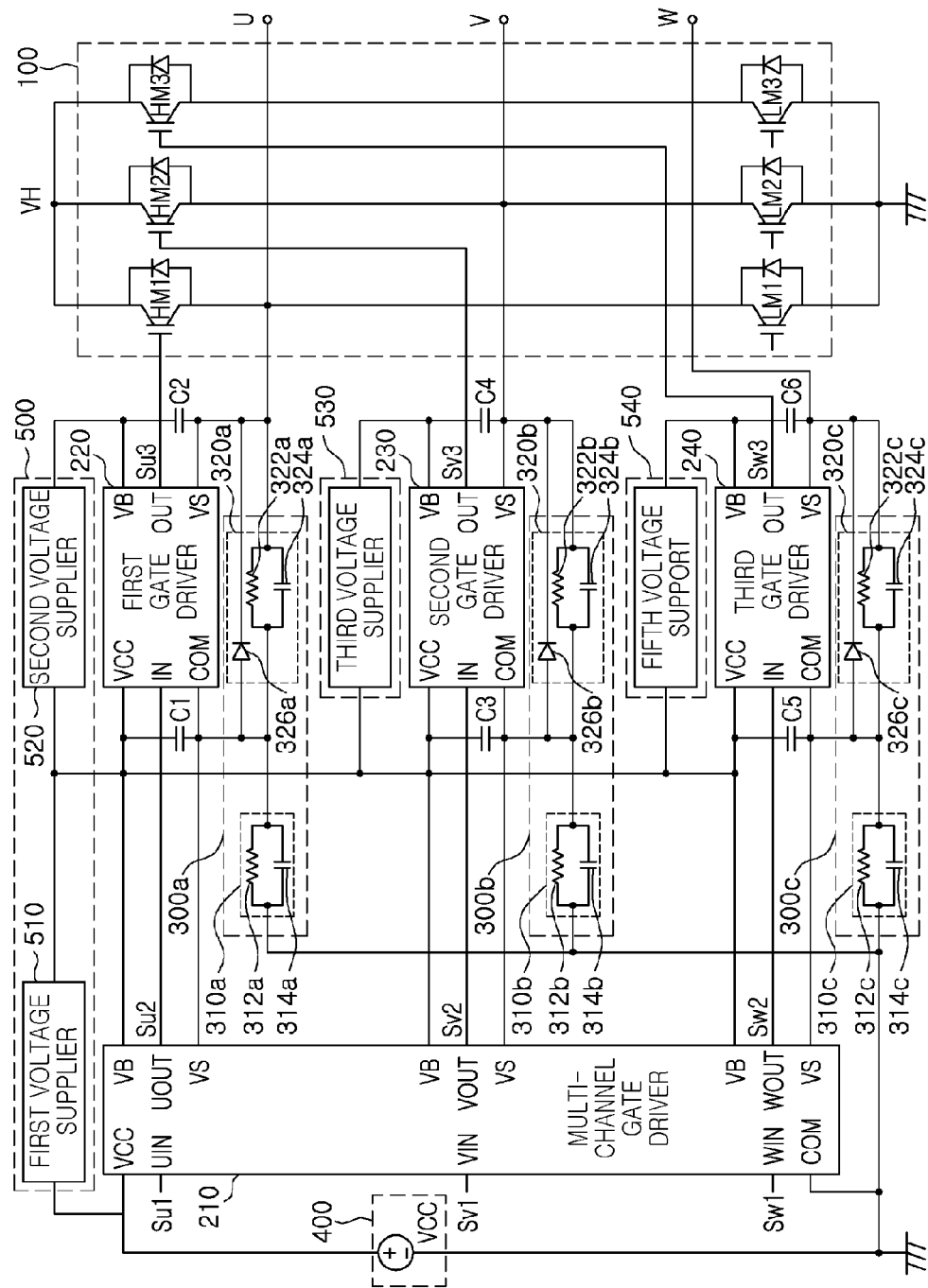
FIG. 4 is a diagram for illustrating another example of the balancing unit shown in FIG. 2.

FIG. 4 is a diagram for illustrating another example of the balancing unit shown in FIG. 2.

Referring to FIG. 4, each of a second balancer 320a, a fourth balancer 320b and a sixth balancer 320c may consist of a resistor 322a, 322b and 322c, a capacitor 324a, 324b and 324c, and a diode 326a, 326b and 326c, respectively.

Figure 5:
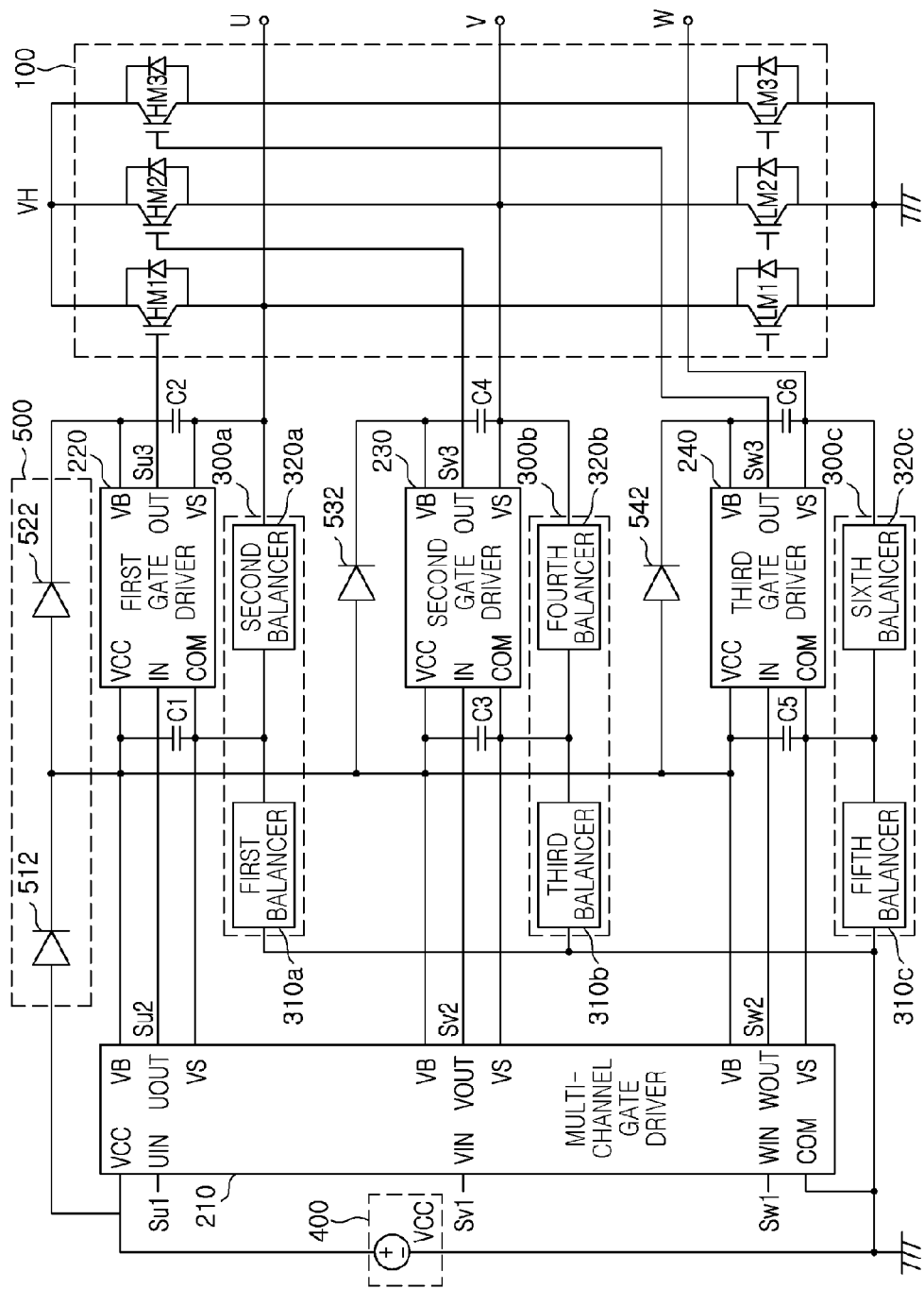
FIG. 5 is a diagram for illustrating an example of the voltage supply unit shown in FIG. 2.

FIG. 5 is a diagram for illustrating an example of the voltage supply unit shown in FIG. 2.

Referring to FIG. 5, the voltage supply unit 500 may include a plurality of diodes 510, 520, 530 and 540.

In the gate driver device shown in FIG. 5, other elements than the voltage supply unit 500 are identical to those described above and, therefore, detailed descriptions on the other elements will be omitted.

The voltage supply unit 500 may transmit voltage from a single voltage source 400 to a multi-channel gate driver 210 or a plurality of gate drivers 220, 230 and 240.

Further, the voltage supply unit 500 may form paths to charge each of capacitors C1, C2, C3, C4, C5 and C6 with the single supply voltage Vcc.

As set forth above, according to exemplary embodiments of the present disclosure, a gate driving device that is stably operable at high voltage, and an inverter having the same can be provided.

Further, according to exemplary embodiments of the present disclosure, a gate driving device capable of preventing voltages above a withstand voltage level from being applied in a transient state, and an inverter having the same can be provided.

While exemplary embodiments have been shown and described above, it will be apparent to those skilled in the art that modifications and variations could be made without departing from the spirit and scope of the present disclosure as defined by the appended claims.

What is claimed is:

1. A gate driving device, comprising:
a plurality of inverter arms, respective inverter arms including a high-side switch and a low-side switch;
a gate driving unit including a multi-channel gate driver that outputs control signals to control switching of the plurality of inverter arms, and a plurality of gate drivers, respective gate drivers configured to receive one of the control signals to output it to a corresponding high-side switch; and
a balancing unit configured to maintain balance of voltage between the multi-channel gate driver and the plurality of gate drivers.

2. The gate driving device of claim 1, wherein the balancing unit includes a plurality of balancers, respective balancers among the plurality of balancers being connected to the multi-channel gate driver and to the respective gate drivers and equally dividing voltage applied to the multi-channel gate driver and respective gate drivers among the plurality of gate drivers.

3. The gate driving device of claim 2, wherein respective balancers includes a resistor connected to the multi-channel gate driver and the respective gate drivers in parallel.

4. The gate driving device of claim 3, wherein respective balancers includes a capacitor connected to the resistor in parallel.

5. The gate driving device of claim 1, wherein the balancing unit maintains a state of voltage divided among the plurality of gate drivers when a signal output from one of the plurality of gate drivers is changed from a high level to a low level.

6. The gate driving device of claim 1, further comprising a single voltage source supplying the gate driving unit with supply voltage.

7. The gate driving device of claim 6, further comprising a voltage supply unit transmitting the supply voltage to the gate drivers.

8. The gate driving device of claim 7, wherein the voltage supply unit includes a plurality of diodes connected to one another in series.

9. The gate driving device of claim 7, wherein the voltage supply unit includes a plurality of diodes connected to one another in parallel.

10. An inverter comprising:
an inverter unit including a plurality of inverter arms, respective inverter arms including a high-side switch and a low-side switch connected in series between an input terminal at which an input voltage of a predetermined level is received and a ground, and switch the input voltage so as to output alternating current power;
a gate driving unit including a multi-channel gate driver that receives instruction signals to instruct switching control of the plurality of inverter arms and output control signals to control the switching of the plurality of inverter arms, and a plurality of gate drivers configured to receive a switching control signal for the high-side switch of one of the plurality of inverter arms from the multi-channel gate driver and output a signal corresponding to the received control signal to the high-side switch; and a balancing unit configured to divide voltage applied to the plurality of gate drivers between the multi-channel gate driver and respective gate drivers among the plurality of gate drivers, according to the switching of the high-side switches, and maintain the divided voltage between the multi-channel gate driver and respective gate drivers among the plurality of gate drivers.

11. The inverter of claim 10, wherein the balancing unit includes a plurality of balancers, respective balancers among the plurality of balancers being connected to the multi-channel gate driver and to the respective gate drivers and equally dividing the voltage applied to respective gate drivers among the plurality of gate drivers.

12. The inverter of claim 11, wherein respective balancers includes a resistor connected to the multi-channel gate driver and the respective gate drivers in parallel.

13. The inverter of claim 12, wherein respective balancers includes a capacitor connected to the resistor in parallel.

* * * * *